United States Patent [19]

Rees

[11] 4,183,033
[45] Jan. 8, 1980

[54] FIELD EFFECT TRANSISTORS

[75] Inventor: Huw D. Rees, Malvern, England

[73] Assignee: National Research Development Corporation, London, England

[21] Appl. No.: 886,199

[22] Filed: Mar. 13, 1978

[51] Int. Cl.² ........................................ H01L 29/80
[52] U.S. Cl. ................................ 357/22; 357/4; 357/23
[58] Field of Search ........................... 357/22, 23, 4

[56]  References Cited

U.S. PATENT DOCUMENTS 3,958,266  5/1976  Athanas .......................... 357/23
3,997,908  12/1976  Schloetterer ..................... 357/23

Primary Examiner—Edward J. Wojciechowicz
Attorney, Agent, or Firm—Pollock, VandeSande and Priddy

[57] ABSTRACT

A field effect transistor for operation at temperatures below 150° K. is capable of operating at low voltage and current levels at high speed. The transistor is fabricated by deposition of metal source drain and gate electrodes upon a layer of semi-conductor having a concentration of free carriers less than $10^{16} cm^{-3}$ formed on a substrate having a resistivity greater than $10^4$ ohm-cm.

7 Claims, 3 Drawing Figures

FIELD EFFECT TRANSISTORS

This invention relates to Field Effects Transistors (FETs) of the type for operation at reduced temperatures.

A FET is a three terminal semi-conductor device in which typically a voltage applied between two electrodes (referred to as the source and the gate) controls the conductivity of semi-conductor in a channel formed under the gate which in turn controls the flow of charge carriers between the source and a third electrode (the drain), current due to the flow of carriers (electrons or holes) between the source and the drain being referred to as the drain current.

A FET in which the channel is formed in n-type semi-conductor is referred to as an n-channel FET. A FET in which the channel is formed in p-type semi-conductor is referred to as a p-channel FET.

There are many different fabrication processes and structures of FETs. A typical n-channel FET comprises an epitaxial layer of n-type semi-conductor formed on a high resistivity substrate, metal source and drain electrodes having an ohmic contact to the epitaxial layer and a gate electrode having a Schottky barrier contact, and is referred to as a metal semi-conductor FET. Alternative constructions are the insulated gate FET in which a gate electrode is insulated from an epitaxial layer by a thin layer of suitable material, such as for example silicon dioxide and the junction FET which has a p-n junction gate contact, the junction being reversed biased in normal operation.

In recent years an operating characteristic of semi-conductor devices which has become of great importance in some uses, such as for example logic circuits, is speed. A high speed circuit requires a device having low capacitance between electrodes and a suitable type of FET is one in which the gate electrode lies between the source and drain ohmic contact regions but does not overlap these regions. With such a device geometry the maximum speed of operation of the FET is chiefly determined by carrier drift velocity in the channel. Carrier drift velocity is itself a function of applied electric field. The function is approximately linear at a low electric field intensities but saturation to a maximum carrier velocity occurs at higher electric field intensities, thus a minimum drain to source voltage is required to bias a FET into saturation which results in some power dissipation within the device. Packing density of semi-conductor devices is increasing and the extraction of heat, generated as a result of power dissipation within devices, presents a problem. This problem is particularly acute when a large number of devices are formed on a single piece of semi-conductor material, as for example in an integrated circuit. In order to overcome the problem, in large electronic systems cooling means is often provided to maintain the semi-conductor devices at a temperature within the range of temperatures at which they can operate normally.

According to the present invention a FET for operation at temperatures below 150° K. includes a layer of semi-conductor on a substrate which has resistivity greater than $10^4$ ohm-cm at temperatures of operation, the layer of semi-conductor having a concentration of free carriers less than $10^{16}$ cm$^{-3}$.

It will be appreciated that a FET in accordance with the present invention may be a p-channel or an n-channel metal semi-conductor or insulated gate or junction FET. In most semi-conductors electron mobility is higher than hole mobility and thus in operation the source to drain voltage may be lower for an n-channel FET than a p-channel FET.

In a metal semi-conductor FET according to the present invention the materials used in the fabrication of the device are chosen to give a suitable barrier height of Schottky barrier gate contact. The barrier height is fixed by choice of materials, and the thickness and doping level of the channel determines the minimum voltage which must be applied to the gate to achieve current flow through the FET (the turn-on voltage). For many logic applications it is convenient to arrange for the turn-on voltage to lie between the normal source operating voltage and the normal drain operating voltage and this condition is important in determining a suitable barrier height. The turn-on voltage may be controlled by inclusion of a layer of semi-conductor doped with donor or acceptor impurities under the gate contact. Donor impurities making the turn-on voltage more negative and acceptor impurities making the turn-on voltage more positive. The doping level of the layer is such that there exists a region under the gate contact which is normally fully depleted of carriers.

Embodiments of the present invention will now be described, with reference to the accompanying figures of which:

Figure 1:
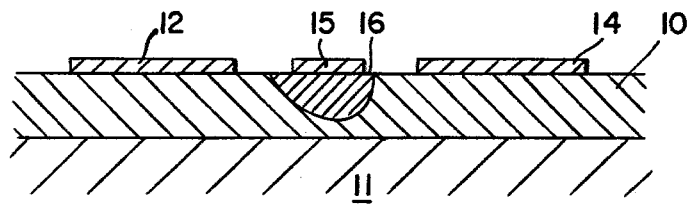
FIG. 1 shows a typical metal semi-conductor FET structure.

A thin layer 10 of semi-conductor is grown on a high resistivity substrate 14 (FIG. 1, which shows a typical metal semi-conductor FET structure). A metal source electrode 12 and a metal drain electrode 14 provide ohmic contacts to the n-layer 10. A metal gate electrode 15 has a Schottky barrier contact to the n-layer 10. A depletion region 16 is formed under the gate electrode 15 and the size of the depletion region 16 depends primarily on the source-gate bias voltage. This voltage controls the total number of electrons under the gate and hence the drain current.

A typical insulated gate FET includes an insulating layer, such as for example a thin layer of oxide, under the gate electrode.

Figure 2A:
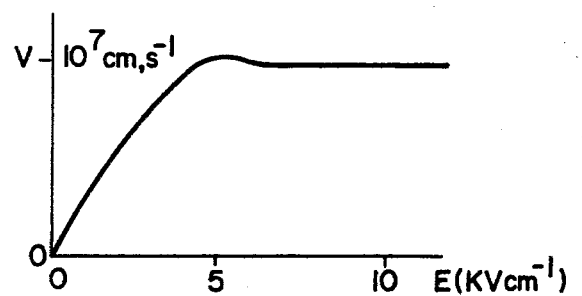
FIG. 2(a) shows the velocity-field characteristic for an n-type gallium arsenide sample as used in a typical prior art FET at room temperature.

The structure described with reference to FIG. 1 is suitable for FETs fabricated from a number of different semi-conductors, such as for example gallium arsenide and indium phosphide. For n-type gallium arsenide of electron density $10^{17}$ cm$^{-3}$ (as may be used for example in a conventional microwave frequency FET for operation at room temperature) the shape of the velocity-field curve at room temperature is indicated in FIG. 2(a) in which carrier drift velocity V is plotted as ordinate and electric-field intensity E as abscissa. It may be seen that velocity saturation occurs at an electric field intensity of approximately 5 KV cm$^{-1}$ depending upon impurity density.

Figure 2B:
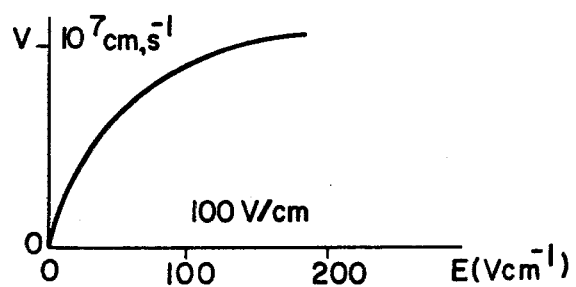
FIG. 2(b) shows the velocity-field characteristic for an n-type gallium arsenide sample of electron density $5 \cdot 10^{14}$ cm$^{-3}$ at 80° K.

At reduced temperatures the free carrier mobility in a high purity semi-conductor is much greater than at room temperature, for example the shape of the velocity-field curve for n-type gallium arsenide of electron density $5 \cdot 10^{14}$ cm$^{-3}$ at 80° K. is indicated in FIG. 2(b).

An embodiment of the present invention for operation below approximately 100° K. (typically 80° K.) may be fabricated by formation of a thin layer (between 0.3 and 1 μm thick) of n-type gallium arsenide of electron density $5 \cdot 10^{14}$ cm$^{-3}$ on a suitable substrate. The substrate material has high-resistivity (greater than $10^4$ ohm-cm), so that interelectrode capacitance is low. The high resistivity of the substrate also reduces undesirable current flow between devices on the same substrate. The material may have a low intrinsic carrier concentration or be doped with impurities producing band gap energy levels that trap electrons and holes. The source to drain electrode spacing is between 2 and 6 μm and the gate electrode is in length approximately one quarter of the source to drain electrode spacing. The depletion region under the gate electrode does not extend below the source and drain electrodes.

In order that the properties of such a FET may be better appreciated FIGS. 2(a) and 2(b) may be compared. Both characteristics are saturating at approximately $10^7$ cm s$^{-1}$ but in the case of gallium arsenide of electron density $5 \cdot 10^{14}$ cm$^{-3}$ at 80° K. the electric field intensity is much lower, approximately 100 V cm$^{-1}$. Hence an embodiment of the present invention operated at a reduced temperature has a proportionally reduced source-drain bias voltage, for example 0.1 V as against 5 V for a conventional FET.

In an alternative embodiment of the present invention a FET is fabricated on a substrate of silicon with a resistivity of greater than $10^4$ ohm-cm at the reduced operating temperature. The high resistivity may be achieved by growing a silicon crystal very pure. Alternatively the resistivity of less pure silicon may be increased by doping with an impurity which produces electronic energy levels between valence and conduction bands which trap electrons or holes produced by ionization of shallow donor or acceptor impurities. A suitable impurity in silicon is silver. The density of the impurity must be high enough to produce sufficient traps (the trap density may be less than the total impurity density). A conducting channel and source and drain regions are doped with a suitable impurity such as for example phosphorus or antimony, the doping level in this case being greater than the density of the traps, approximately $10^{15}$ cm$^{-3}$ in the conducting channel and greater than $10^{17}$ cm$^{-3}$ (typically $10^{19}$ cm$^{-3}$) in the source and drain contact regions. The gate contact may be formed as a Schottky barrier by evaporating platinum onto the silicon and heat treating the silicon or alternatively an insulated gate FET may be made by growing a thin layer of silicon dioxide (approximately 500 Å thick) on top of the silicon and evaporating a metal such as for example aluminum, on top of the silicon dioxide layer.

Electron drift velocities are comparable for a conventional FET and a FET according to the present invention operated at a reduced temperature of similar dimensions but since the channel of the latter is formed in a high purity semi-conductor the direct current through such a device is reduced by a factor of approximately 100 over a conventional device (for example, 1 mA instead of 100 mA for a conventional device).

It will be appreciated that the present invention provides a FET for operation at reduced temperatures having similar properties to a conventional FET, the voltages and currents associated with a FET according to the present invention being lower, typically by a factor of 100, for a device of comparable dimensions. Therefore the dynamic range of such a FET is lower. A FET in accordance with the present invention is suitable for use in amplifier circuits where a reduced dynamic range is acceptable and where low power consumption for a given device speed is important. The operating current and voltage levels of such a device make it particularly suitable for use in a logic circuit where capability to drive a load impedance below 500 ohms is an advantage. In very high speed circuits transmission lines are necessary for connection of elements over distances greater than about a millimeter and the typical impedance of such a transmission line is less than 500 ohms. In other circuits the low output impedance of such a FET logic circuit is an advantage for the rapid charging of parasitic capacitances. A FET in accordance with the present invention may be used in a logic circuit to drive transmission lines. Such an arrangement is useful in an integrated circuit comprising many logic elements with complex inter-connection pattern, as for example in a random-access memory.

What I claim is:

1. A field effect transistor maintained at an operating temperature below 150° K. comprising:
    a substrate of resistivity greater than $10^4$ ohm-cm at the operating temperature;
    a layer of semiconductor formed thereon;
    metal source, drain and gate electrodes in contact with said substrate;
    said source and said drain electrodes being arranged with respect to said gate electrode to provide a controllable channel in said layer for charge carrier flow therebetween;
    said layer having a concentration of free carriers less than $10^{16}$ cm$^{-3}$ such that, at the operating temperature, carrier velocity saturation in said layer is achieved at an applied electric field intensity of less than 1 KVcm$^{-1}$.

2. A field effect transistor as claimed in claim 1 wherein said layer is formed of gallium arsenide of electron density $5 \cdot 10^{14}$ cm$^{-3}$.

3. A field effect transistor as claimed in claim 1 having a second-layer of semicondutor under said gate electrode, said second-layer being doped with donor impurities.

4. A field effect transistor as claimed in claim 1 having a second-layer of semiconductor under said gate electrode, said second-layer being doped with acceptor impurities.

5. A field effect transistor as claimed in claim 3 wherein there exists a region under said gate electrode, said region being normally fully depleted of carriers.

6. A field effect transistor as claimed in claim 4 wherein there exists a region under said gate electrode, said region being normally fully depleted of carriers.

7. A field effect transistor as claimed in claim 1, there being formed on said substrate a plurality of transistors.

* * * * *